United States Patent
Miller et al.

(10) Patent No.: US 6,449,524 B1
(45) Date of Patent: Sep. 10, 2002

(54) METHOD AND APPARATUS FOR USING EQUIPMENT STATE DATA FOR RUN-TO-RUN CONTROL OF MANUFACTURING TOOLS

(75) Inventors: Michael L. Miller, Cedar Park; Thomas J. Sonderman, Austin, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/477,465

(22) Filed: Jan. 4, 2000

(51) Int. Cl.⁷ .............................................. G06F 19/00
(52) U.S. Cl. ....................................... 700/121; 700/48
(58) Field of Search ............................ 700/48, 95, 116, 700/106, 115, 121; 705/74, 15, 27, 28; 709/223; 714/48

(56) References Cited

U.S. PATENT DOCUMENTS

| | | | |
|---|---|---|---|
| 5,105,362 A | 4/1992 | Kotani | 700/121 |
| 5,494,440 A | 2/1996 | Spaan et al. | 700/121 |
| 5,495,417 A | 2/1996 | Fuduka et al. | 700/108 |
| 5,711,843 A | 1/1998 | Jahns | 156/345 |
| 5,859,964 A * | 1/1999 | Wang et al. | 714/48 |
| 5,866,437 A | 2/1999 | Chen et al. | 438/14 |
| 5,966,312 A * | 10/1999 | Chen | 700/108 |
| 6,263,255 B1 * | 7/2001 | Tan et al. | 700/106 |

FOREIGN PATENT DOCUMENTS

| | | |
|---|---|---|
| WO | 00 79355 | 12/2000 |
| WO | 01 11678 | 2/2001 |
| WO | 01 11679 | 2/2001 |

OTHER PUBLICATIONS

Hu, Albert, et al, entitled, "Concurrent Deployment of Run by Run Controller Using SCC Framework," Proceedings of the International Semiconductor Manufacturing Science Symposium (ISMSS), New York, IEEE, vol. Symp. 5, Jul. 19, 1993, pp. 126–132, XP000475399 (the whole document).

Miller, Michael L., entitled, "Impact of Multi–Product and—Process Manufacturing On Run–to–Run Control," Process, Equipment, and Materials Control in Integrated Circuit Manufacturing III, Austin, TX, Oct. 1–2, 1997, vol. 3213, pp. 138–146, XP000992500 Proceedings of the SPIE—The International Society for Optical Engineering, 1997, SPIE–Int. Soc. Opt. Eng, USA, ISSN: 0277–786X (the whole document).

* cited by examiner

Primary Examiner—Leo Picard
Assistant Examiner—Kidest Bahta
(74) Attorney, Agent, or Firm—Williams, Morgan & Amerson, P.C.

(57) ABSTRACT

The present invention provides for a method and an apparatus for using equipment state data for controlling a manufacturing process. Initial equipment state data is acquired. At least one semiconductor device is processed using the initial equipment state data is performed. Equipment and wafer state data processing is performed using data from the processing of the semiconductor device and the initial equipment state data. A determination is made whether at least one control input parameter used for processing of the semiconductor device is to be modified in response to performing the equipment and wafer state data processing. The control input parameter is modified in response to determining that at least one the control input parameter is to be modified.

29 Claims, 4 Drawing Sheets

METHOD AND APPARATUS FOR USING EQUIPMENT STATE DATA FOR RUN-TO-RUN CONTROL OF MANUFACTURING TOOLS

BACKGROUND OF THE INVENTION

1. Field of the Invention

This invention relates generally to semiconductor products manufacturing, and, more particularly, to a method and apparatus for using of equipment state data and fault detection in run-to-run control of manufacturing tool operation.

2. Description of the Related Art

The technology explosion in the manufacturing industry has resulted in many new and innovative manufacturing processes. Today's manufacturing processes, particularly semi-conductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semi-conductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical (CMT) control , and overlay control. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month. The results from the analysis of the overlay errors are used to make updates to exposure tool settings manually. Some of the problems associated with the current methods include the fact that the exposure tool settings are only updated a few times a month. Furthermore, currently the exposure tool updates are performed manually.

In some cases, where automatic adjustments of exposure tool settings are made on a lot-by-lot or a batch-by-batch basis, particularly adjustments that are made based upon post-process measurements, changes in the process or the manufacturing tool that result in a misalignment of the pattern on the wafer can go undetected until the post-process measurements are made. Furthermore, when some wafers, wafer lots, or wafer batches are not measured, the potential impact of misalignment problems can increase.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. Often, semiconductor devices are staged through multiple manufacturing tools for multiple processes, generating data relating to the quality of the processed semiconductor devices. Many times, inaccuracies in manufacturing processes cannot be measured because they may involve a semiconductor process characteristic that may be difficult to measure. This could cause quality problems that may otherwise be corrected if data relating to the inaccuracies had been acquired. Furthermore, delays in measurements, or reduced sampling of product wafers, can cause the quality problems to affect an increased amount of products.

The present invention is directed to overcoming, or at least reducing the effects of, one or more of the problems set forth above.

SUMMARY OF THE INVENTION

In one aspect of the present invention, a method is provided for using equipment state data for controlling a manufacturing process. Initial equipment state data is acquired. At least one semiconductor device is processed using the initial equipment state data is performed. Equipment and wafer state data processing is performed using data from the processing of the semiconductor device and the initial equipment state data. A determination is made whether at least one control input parameter used for processing of the semiconductor device is to be modified in response to performing the equipment and wafer state data processing. The control input parameter is modified in response to determining that at least one the control input parameter is to be modified.

In another aspect of the present invention, an apparatus is provided for using equipment state data for controlling a manufacturing process. The apparatus of the present invention comprises: means for acquiring an initial equipment state data; means for performing a manufacturing process of at least one semiconductor device using the initial equipment state data; means for performing an equipment and wafer state data processing using data from the processing of the semiconductor device and the initial equipment state data; means for determining whether at least one control input parameter used for the process of the semiconductor device is to be modified in response to performing the equipment and wafer state data processing; and means for modifying the control input parameter in response to a determination that at least one the control input parameter is to be modified.

BRIEF DESCRIPTION OF THE DRAWINGS

The invention may be understood by reference to the following description taken in conjunction with the accompanying drawings, in which like reference numerals identify like elements, and in which.

Figure 1:
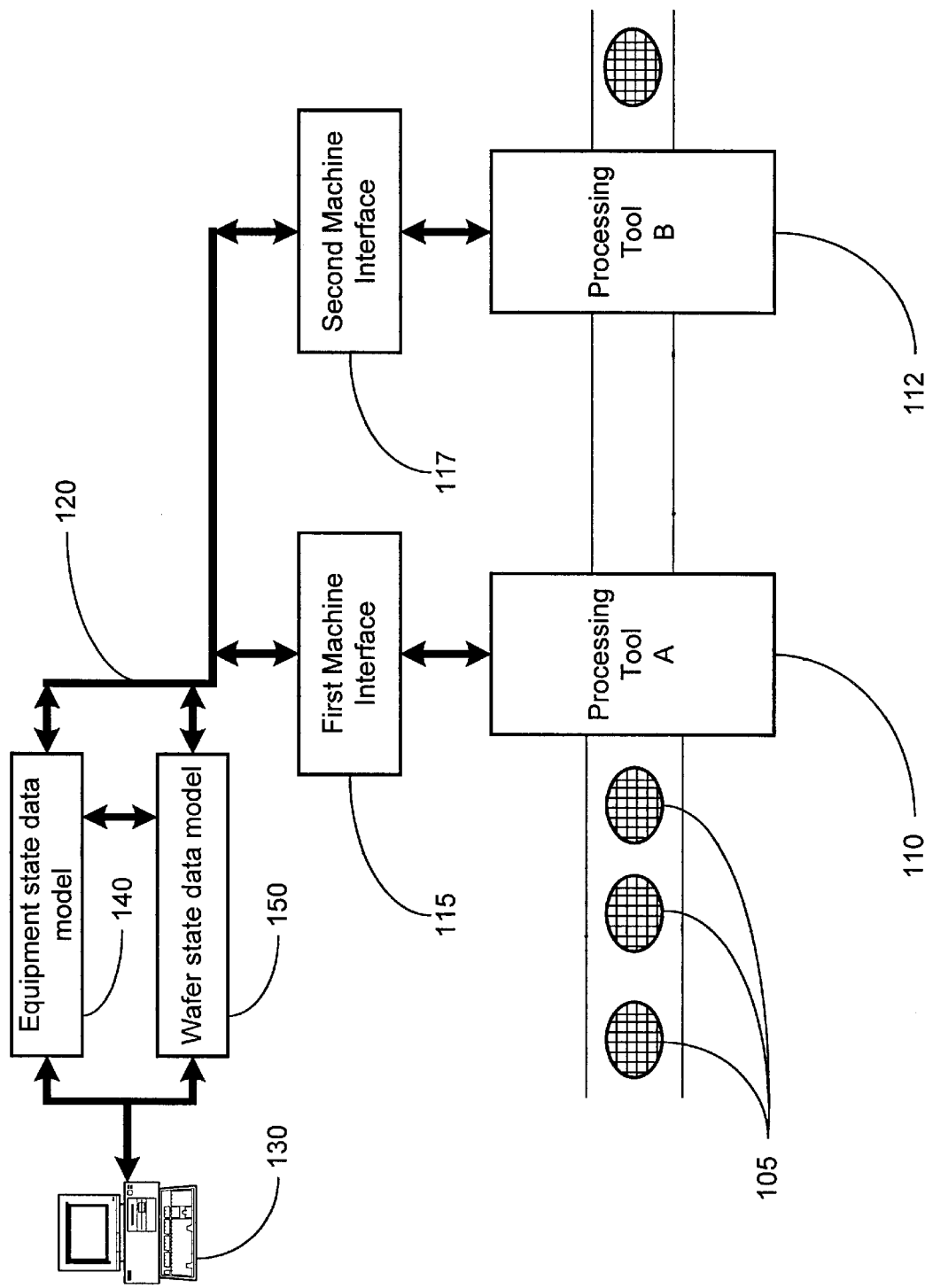
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. As semiconductor devices are processed through manufacturing tools, production data is generated. The production data can be used to perform fault detection analysis, which can lead to improved manufacturing results. Overlay process is an important group of process steps in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of acquiring production data and using that data to adjust the process control parameters to improve process quality. The present invention also provides a method of acquiring equipment state data, from sources such as equipment sensors, and using the equipment state data to adjust process control parameters to improve process quality in semiconductor manufacturing. Run-to-run control in manufacturing of semiconductor devices generally refers to manipulating a process recipe on a wafer-by-wafer, lot-by-lot, or a batch-by-batch basis to achieve one or more quality targets based upon measurements of data relating to that quality. Equipment state data generally refers to manufacturing measurements that are typically performed real-time during the course of the processing of a semiconductor wafer. Equipment state data generally reflects the data relating to current operation of equipment characteristics, such as chamber temperature, chamber pressure, process gas flow rates, and the like.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the control input signals are also generated by the computer system 130 utilizing an equipment state data model 140 and a wafer state data model 150. The equipment state data model 140 and a wafer state data model 150 are used to find inaccuracies in manufacturing processes and make correction on a run-to-run basis. In one embodiment, wafer state data refers to measurement data that is acquired on a semiconductor wafer that directly or indirectly indicates the condition of the semiconductor wafer. Wafer state data includes data relating to trace line width, overlay offset, trace resistivity, and the like.

Run-to-run control in semiconductor manufacturing generally refers to using off-line or on-line metrology tools to measure some output parameters of a semiconductor manufacturing process. The measured output parameters of the semiconductor manufacturing are then used to make adjustment to a recipe, such as control input parameters, associated with a particular processing tool 110, 112. For instance, during the placement of a polish onto a semiconductor wafer during a chemical-mechanical polisher planarization process, one objective is to process a semiconductor wafer with a process film on it and polish down the process film such that the process film is relatively flat and has a predetermined thickness. Generally, after a processing tool 110, 112 polishes a semiconductor wafer, a metrology tool is utilized to measure the process film thickness on a variety of sites across the semiconductor wafer, to determine if a desired film thickness and uniformity has been achieved. The measurement of the film thickness and uniformity can be then used to adjust the control input parameters on the line 120 for the next run of semiconductor wafers.

In one embodiment, the first and second machine interfaces 115, 117 are located outside the processing tools 110, 112. In an alternative embodiment, the first and second machine interfaces 115, 117 are located within the processing tools 110, 112. In one embodiment, the computer system 130 sends control input signals on a line 120 to the first and second machine interfaces 115, 117. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers.

For processing tools such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of detecting and organizing fault data for semiconductor manufacturing processes.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

In some examples of semiconductor manufacturing, there may not exist sufficient metrology data to modify control input parameters for a subsequent run of semiconductor wafers. One example of semiconductor processing where metrology data may be inadequate is an ion implant process. Immediately after implanting ions in a semiconductor wafer, it is difficult to measure the implanted ion concentration on the semiconductor wafer. Although, there are some indications of the implanted ion concentration on the ion implant dose setting on an ion implantation processing tool, an accurate indication of the implanted ion concentration is generally not obtained until the semiconductor wafer processing is largely complete and electrical testing is performed. Generally, at this point, data relating to the implanted ion concentration is not very useful, since it is generally too late to correct any ion implantation errors on the processed semiconductor wafer. The present invention provides for a method of acquiring equipment state data, or trace data, and determining whether the control settings used to process a semiconductor wafer are normal or abnormal using, for instance, a model relating to equipment state data. When a determination is made that the equipment state data is abnormal, the run-to-run process controller is adjusted to cause the semiconductor process to be normal, based upon the equipment state data. In one embodiment, equipment state data relates to the manner in which the processing tool 110, 112 is functioning. Equipment state data includes data such as temperatures and pressures under which a processing tool 110, 112 is operating. In contrast, wafer state data relates to the properties of the semiconductor wafer being processed. Wafer state data includes data obtained by metrology tools, including film thickness in film processes and line widths in photolithography processes. In one embodiment, wafer state data and equipment state data could be used to drive a controller, such as a run-to-run controller.

In one embodiment, in the absence of adequate wafer state data, equipment state data can be utilized to approximate the wafer state data at a particular period of time during a semiconductor process step. In one embodiment, the equipment state data model 140 is used to analyze the equipment state data. When the equipment state data model 140 determines that the quality of the examined equipment state data justifies continued semiconductor processing, the data is examined by the wafer state data model 150.

In one embodiment, the wafer state data model 150 correlates, or relates, equipment state data to wafer state data. In one embodiment, a computer software program that contains predetermined instructions and parameters can perform the correlation between equipment state data to wafer state data. One objective of performing the aforementioned correlation is to estimate the wafer-state parameters based upon the equipment state data. Referring to the chemical-mechanical polisher planarization process example described above, when a polishing process is being performed on a semiconductor wafer, equipment state data, such as a table rotation speed, down force, and flow rate of the process slurry into the pad, is collected. Examination of the collected equipment state data can then be used to determine the condition of the process tool's performance. An empirical-based or physical-based relationship can then be generated to determine the thickness of the process film applied onto the semiconductor wafer, thereby creating a relationship between the equipment state data and wafer state data. In other words, a predetermined relationship can be established that relates a particular table rotation speed, a particular down force, and a particular process slurry flow rate to a certain process film thickness, allowing one to predict wafer state data based upon equipment state data. The predicted wafer state data can then be used to modify control input parameters on the line 120 on a run-to-run basis. Furthermore, when wafer-state data is subsequently available, the wafer-state data can be sued to improve the manufacturing model 140 by relating the equipment state data and the wafer state data.

Figure 2:
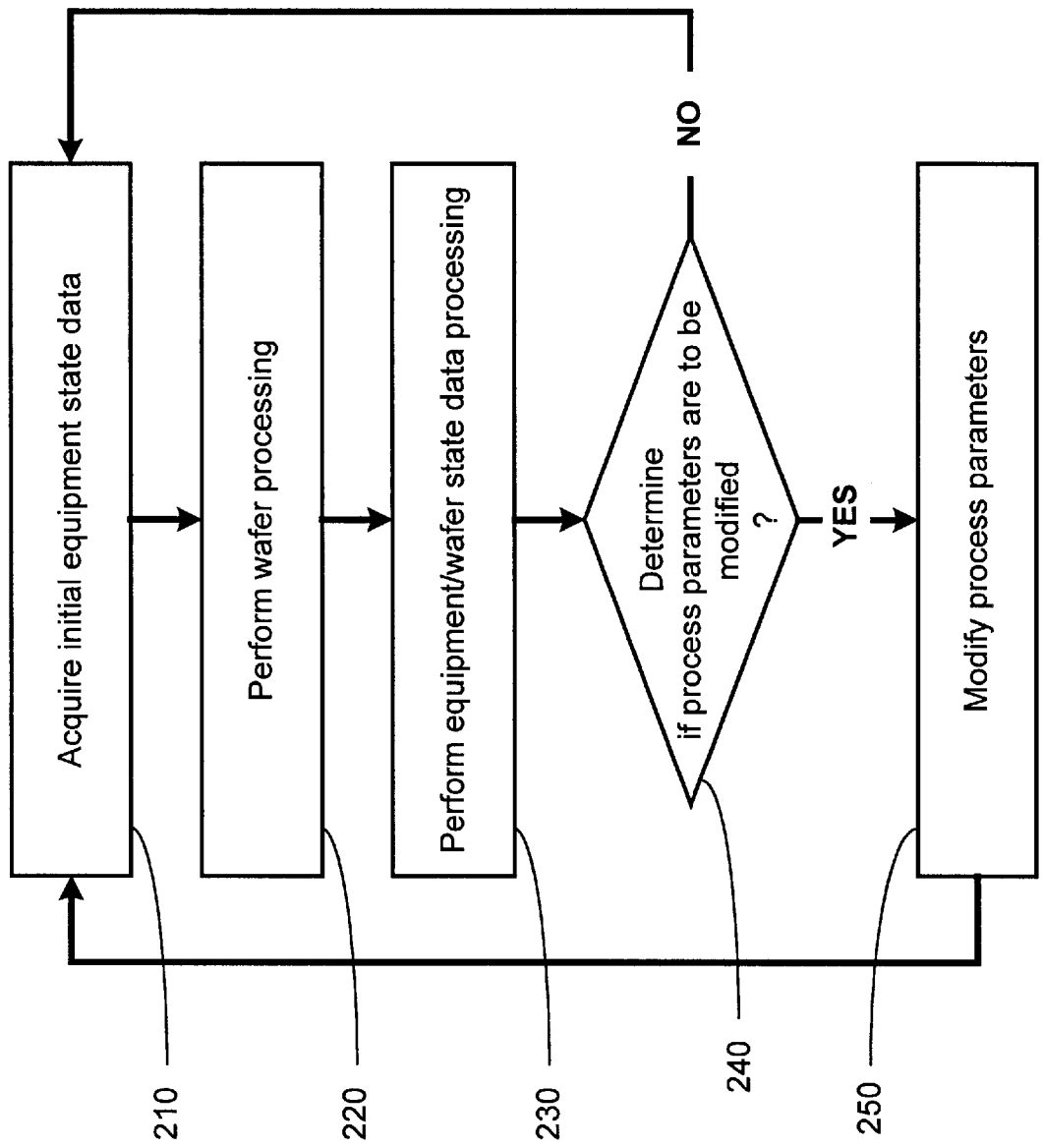
FIG. 2 illustrates one embodiment of the method for acquiring and processing equipment state data as taught by the present invention.

Turning now to FIG. 2, one embodiment of the method for acquiring and processing equipment state data, as taught by the present invention, is illustrated. Initial equipment state data, such as the control setting for a processing tool 110, 112, the temperature, the humidity, and the pressure conditions during processing, is acquired, as described in block 210 of FIG. 2. In one embodiment, the initial equipment state data is tracked by the equipment state data model 140. Subsequently, at least one run of wafer processing is performed, as described in block 220 of FIG. 2. Equipment and wafer state data processing is then performed, as described in block 230 of FIG. 2. A more detailed description of one embodiment of performing equipment and wafer state data processing, described in block 230, is illustrated in FIG. 3.

Figure 3:
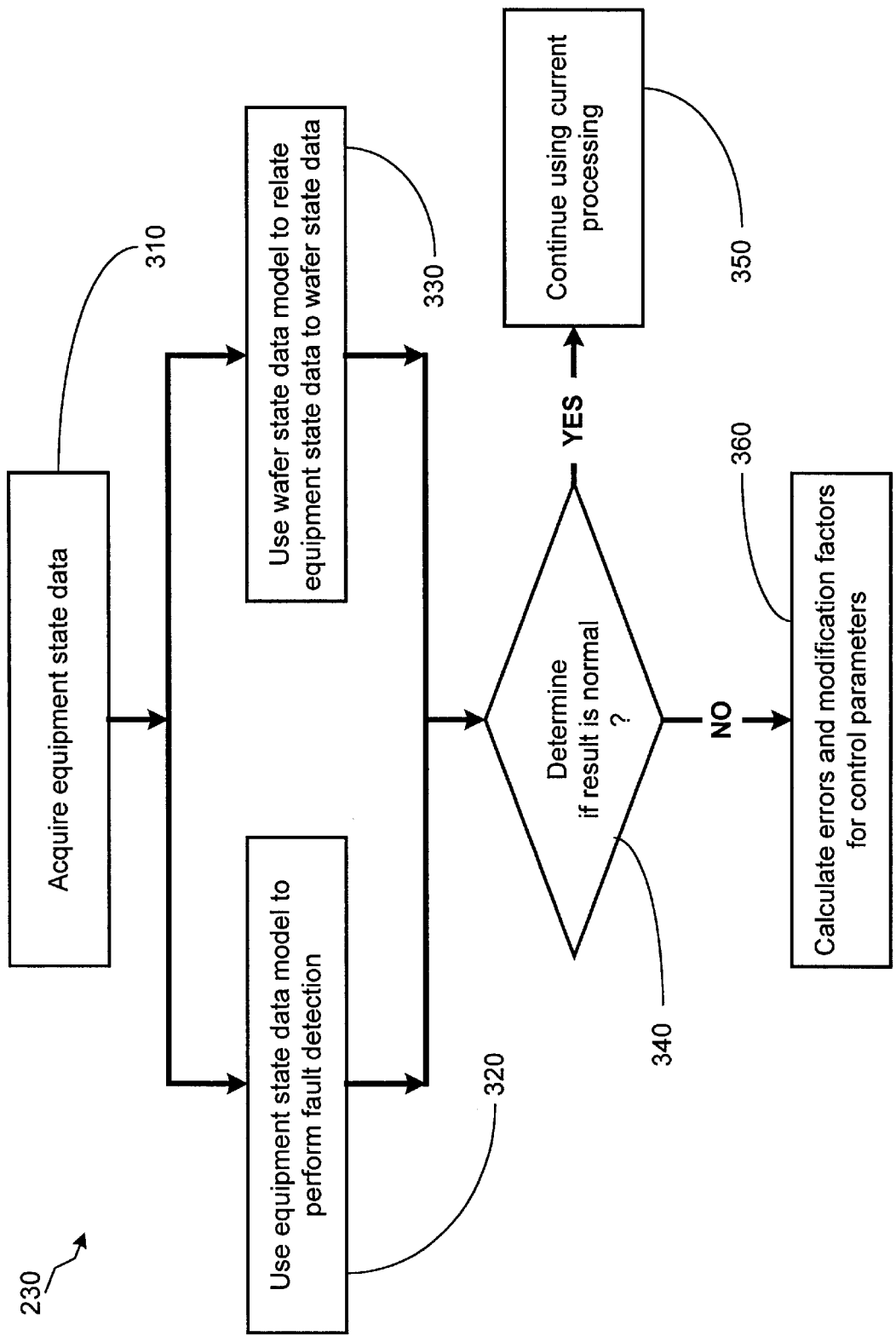
FIG. 3 illustrates a flowchart representation of a more detailed description of the method of performing equipment/wafer state data processing described in FIG. 2.

Turning now to FIG. 3, equipment state data associated with processing and post processing of semiconductor wafers, such as table rotation speed, down force, and flow rate of the process slurry, temperature, humidity and pressure conditions, are acquired, as described in block 310 of FIG. 3. In one embodiment, the equipment state data is stored and analyzed by the equipment state data model 140. In one embodiment, the equipment state data model 140 examines equipment state data and performs fault detection upon the data, as described in block 320 of FIG. 3. When the equipment state data model 140 determines that the quality of the examined equipment state data justifies continued semiconductor processing, the data is examined by the wafer state data model 150.

In one embodiment, the wafer state data model 150 correlates, or relates, equipment state data to wafer state data, as described in block 330 of FIG. 3. In one embodiment, a computer software program that contains predetermined instructions and parameters can perform the correlation between equipment state data to wafer state data. A determination is then made whether the state of the wafer predicted by the correlation of the equipment state data to wafer state data is normal or abnormal, as described in block 340 of FIG. 3. When a determination is made that the predicted result from the wafer state data is normal, semiconductor wafer processing using the current control input parameters is continued, as described in block 350 of FIG. 3. When a determination is made that the predicted result from the wafer state data is abnormal, modification factors for modifying control input parameters and errors are calculated, as described in block 360 of FIG. 3. The completion of the step described in block 360 concludes the process of performing equipment and wafer state data processing described in block 230 of FIG. 2.

Turning back to FIG. 2, after the equipment and wafer state data processing is performed, the data is used to determine whether semiconductor wafer process parameters are to be modified, as described in block 240 of FIG. 2. When a determination is made that the semiconductor wafer process parameters are not to be modified, initial equipment state data is acquired and a subsequent run of semiconductor wafers are processed, as described in FIG. 2. When a determination is made that the semiconductor wafer process parameters are to be modified, control input parameters on the line 120 are modified, initial equipment state data is acquired and a subsequent run of semiconductor wafers are processed, as described in block 250 of FIG. 2

Figure 4:
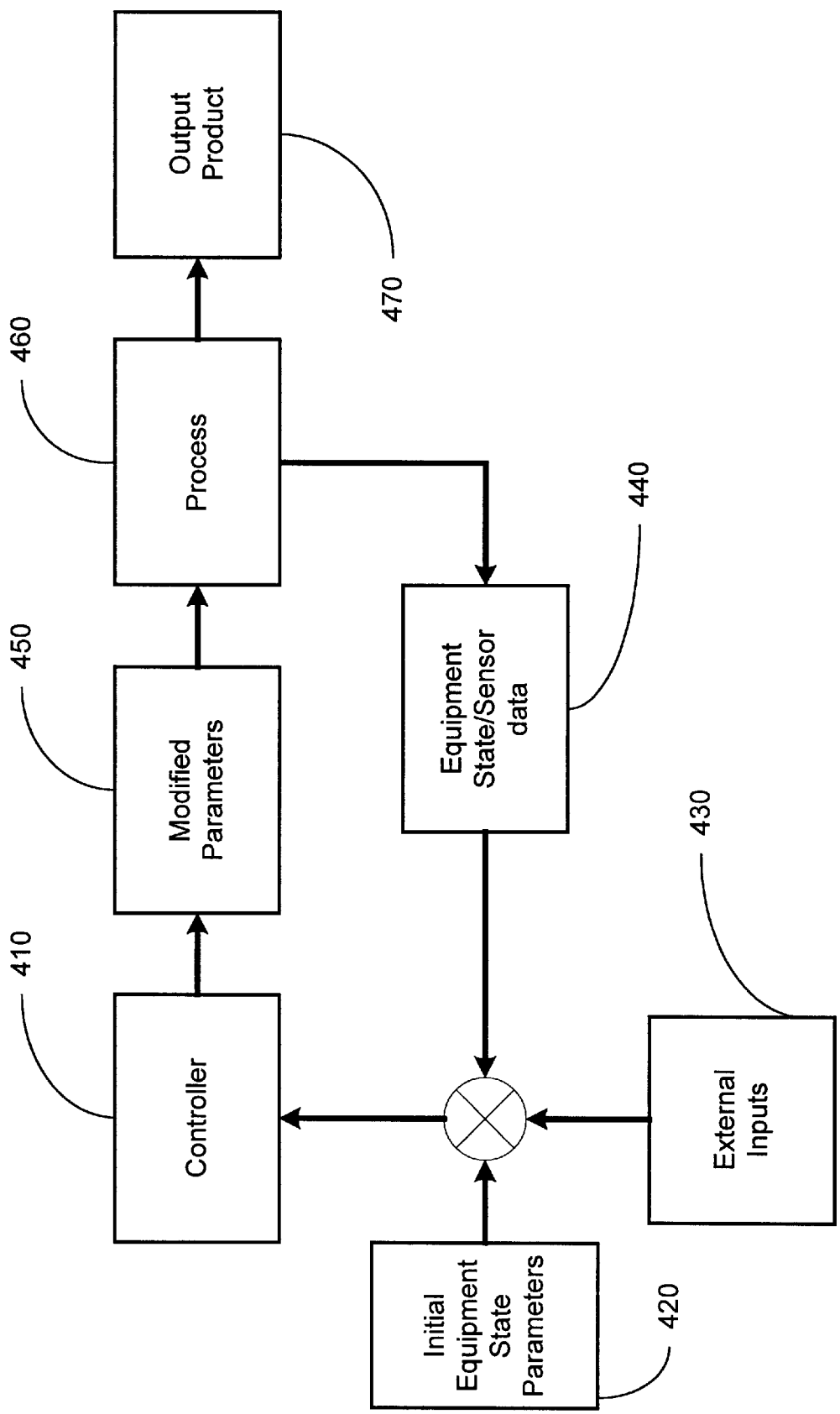
FIG. 4 illustrates a flowchart representation of a more detailed description of the method of performing equipment/wafer state data processing described in FIG. 2.

Turning now to FIG. 4, one embodiment of a system that is capable of performing the methods taught by the present invention is illustrated. A controller 410 receives an input that comprises a summation of initial equipment state parameters 420, external inputs 430, and feedback signals from equipment state/sensor data 440. In one embodiment, the controller 410 is a run-to-run controller.

The controller 410 implements modifications to control input parameters and sends modified parameters 450 to a process 460. In one embodiment, the controller 410 uses the equipment state data model 140 and the wafer state data model 150 to implement the methods taught by the present invention and modify the control input parameters on the line 120. Upon execution of the process 460, feedback data is generated in the form of equipment state/sensor data 440, which is summed together with initial equipment state parameters 420 and external inputs 430 and are sent to the controller 410. The process 460 is executed using modified parameters 450 to produce the output product 470, which in one embodiment is processed semiconductor wafers. The methods taught by the present invention can be utilized in a variety of manufacturing processes in addition to semiconductor device manufacturing.

The principles taught by the present invention can be implemented in an Advanced Process Control (APC) Framework. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for using equipment state data for controlling a manufacturing process, comprising:

acquiring initial equipment state data;

processing at least one semiconductor device using said initial equipment state data;

performing equipment and wafer state data processing using data from said processing of said semiconductor device and said initial equipment state data, said equipment and wafer state data processing comprising:
acquiring equipment state data;
acquiring wafer state data; and
relating equipment state data with wafer state data to determine an error;

determining whether at least one control input parameter used in said processing of said semiconductor device is to be modified in response to performing said equipment and wafer state data processing; and modifying said control input parameter in response to determining that at least one said control input parameter is to be modified.

2. The method described in claim 1, wherein acquiring an initial equipment state data further comprises at least one of:

acquiring at least one initial input control setting of a processing tool;

acquiring a temperature data during said process of said semiconductor device;

acquiring a humidity data during said process of said semiconductor device; and acquiring a pressure data during said process of said semiconductor device.

3. The method described in claim 1, wherein performing a manufacturing process of at least one semiconductor device further comprises performing a manufacturing process of at least one semiconductor wafer.

4. The method described in claim 1, wherein performing a manufacturing process of at least one semiconductor device further comprises performing a photolithography overlay process.

5. The method described in claim 1, wherein performing a manufacturing process of at least one semiconductor device further comprises performing an ion implantation process.

6. The method described in claim 1, wherein performing a manufacturing process of at least one semiconductor device further comprises performing a chemical-mechanical polisher planarization process.

7. The method described in claim 1, wherein performing an equipment and wafer state data processing further comprises:

acquiring equipment state data;

performing fault detection using an equipment state data model and said acquired equipment state data;

predicting a wafer state data using a wafer state data model and said acquired equipment state data in response to said fault detection;

determining whether said wafer state data is abnormal; and calculating errors and modification factors of at least one control input parameter in response to a determination that said wafer state data is abnormal.

8. The method described in claim 7, wherein acquiring equipment state data further comprises at least one of:

acquiring table rotation speed data;

acquiring down force data;

acquiring a flow rate of a process slurry data;

acquiring temperature data during said process of said semiconductor device;

acquiring humidity data during said process of said semiconductor device; and acquiring pressure data during said process of said semiconductor device.

9. The method described in claim 7, wherein performing fault detection using an equipment state data model and said acquired equipment state data further comprises determining whether the quality of said equipment state data justifies continued semiconductor processing.

10. The method described in claim 7, wherein predicting a wafer state data further comprises predicting at least one of:

predicting a thickness of a process film;

predicting a uniformity of a process film;

predicting a concentration of an ion implantation; and predicting an alignment of registration.

11. The method described in claim 7, wherein predicting a wafer state data using a wafer state data model and said acquired equipment state data further comprises performing an empirical based analysis of said equipment state data for predicting said wafer state data.

12. The method described in claim 7, wherein predicting a wafer state data using a wafer state data model and said acquired equipment state data further comprises performing an physical based analysis of said equipment state data for predicting said wafer state data.

13. The method described in claim 7, wherein determining whether said wafer state data is abnormal further comprises comparing said wafer state data to a predetermined comparison data.

14. The method described in claim 1, wherein modifying said control input parameter further comprises modifying said control input parameter on a run-to-run basis.

15. An apparatus for using equipment state data for controlling a manufacturing process, comprising:

means for acquiring initial equipment state data;

means for processing at least one semiconductor device using said initial equipment state data;

means for performing equipment and wafer state data processing using data from said processing of said semiconductor device and said initial equipment state data, said equipment and wafer state data processing comprising:
acquiring equipment state data;
acquiring wafer state data; and
relating equipment state data with wafer state data to determine an error;

means for determining whether at least one control input parameter used in said processing of said semiconductor device is to be modified in response to performing said equipment and wafer state data processing; and means for modifying said control input parameter in response to determining that at least one said control input parameter is to be modified.

16. A computer readable program storage device encoded with instructions that, when executed by a computer, performs a method for using equipment state data for controlling a manufacturing process, comprising:

acquiring initial equipment state data;

processing at least one semiconductor device using said initial equipment state data;

performing equipment and wafer state data processing using data from said processing of said semiconductor device and said initial equipment state data, said equipment and wafer state data processing comprising:
acquiring equipment state data;
acquiring wafer state data; and
relating equipment state data with wafer state data to determine an error;

determining whether at least one control input parameter used in said processing of said semiconductor device is to be modified in response to performing said equipment and wafer state data processing; and modifying said control input parameter in response to determining that at least one said control input parameter is to be modified.

17. The computer readable program storage device encoded with instructions that, when executed by a computer, performs the method described in claim 16, wherein acquiring an initial equipment state data further comprises at least one of:

acquiring at least one initial input control setting of a processing tool;

acquiring a temperature data during said process of said semiconductor device;

acquiring a humidity data during said process of said semiconductor device; and acquiring a pressure data during said process of said semiconductor device.

18. The computer readable program storage device encoded with instructions that, when executed by a computer, performs the method described in claim 16, wherein performing a manufacturing process of at least one semiconductor device further comprises performing a manufacturing process of at least one semiconductor wafer.

19. The computer readable program storage device encoded with instructions that, when executed by a computer, performs the method described in claim 16, wherein performing a manufacturing process of at least one semiconductor device further comprises performing a photolithography overlay process.

20. The computer readable program storage device encoded with instructions that, when executed by a computer, performs the method described in claim 16, wherein performing a manufacturing process of at least one semiconductor device further comprises performing an ion implantation process.

21. The computer readable program storage device encoded with instructions that, when executed by a computer, performs the method described in claim 16, wherein performing a manufacturing process of at least one semiconductor device further comprises performing a chemical-mechanical polisher planarization process.

22. The computer readable program storage device encoded with instructions that, when executed by a computer, performs the method described in claim 16, wherein performing an equipment and wafer state data processing further comprises:

acquiring equipment state data;

performing fault detection using an equipment state data model and said acquired equipment state data;

predicting a wafer state data using a wafer state data model and said acquired equipment state data in response to said fault detection;

determining whether said wafer state data is abnormal; and calculating errors and modification factors of at least one control input parameter in response to a determination that said wafer state data is abnormal.

23. The computer readable program storage device encoded with instructions that, when executed by a computer, performs the method described in claim 22, wherein acquiring equipment state data further comprises at least one of:

acquiring table rotation speed data;

acquiring down force data;

acquiring a flow rate of a process slurry data;

acquiring temperature data during said process of said semiconductor device;

acquiring humidity data during said process of said semiconductor device; and acquiring pressure data during said process of said semiconductor device.

24. The computer readable program storage device encoded with instructions that, when executed by a computer, performs the method described in claim 22, wherein performing fault detection using an equipment state data model and said acquired equipment state data further comprises determining whether the quality of said equipment state data justifies continued semiconductor processing.

25. The computer readable program storage device encoded with instructions that, when executed by a computer, performs the method described in claim 22, wherein predicting a wafer state data further comprises predicting at least one of:

predicting a thickness of a process film;

predicting a uniformity of a process film;

predicting a concentration of an ion implantation; and predicting an alignment of registration.

26. The computer readable program storage device encoded with instructions that, when executed by a computer, performs the method described in claim 22, wherein predicting a wafer state data using a wafer state data model and said acquired equipment state data further comprises performing an empirical based analysis of said equipment state data for predicting said wafer state data.

27. The computer readable program storage device encoded with instructions that, when executed by a computer, performs the method described in claim 22, wherein predicting a wafer state data using a wafer state data model and said acquired equipment state data further comprises performing an physical based analysis of said equipment state data for predicting said wafer state data.

28. The computer readable program storage device encoded with instructions that, when executed by a computer, performs the method described in claim 22, wherein determining whether said wafer state data is abnormal further comprises comparing said wafer state data to a predetermined comparison data.

29. The computer readable program storage device encoded with instructions that, when executed by a computer, performs the method described in claim 16, wherein modifying said control input parameter further comprises modifying said control input parameter on a run-to-run basis.

\* \* \* \* \*